United States Patent [19]
Miyake et al.

[11] Patent Number: 5,896,438
[45] Date of Patent: Apr. 20, 1999

[54] X-RAY OPTICAL APPARATUS AND DEVICE FABRICATION METHOD

[75] Inventors: Akira Miyake, Utsunomiya; Masami Tsukamoto, Yokohama, both of Japan

[73] Assignee: Canon Kabushiki Kaisha, Tokyo, Japan

[21] Appl. No.: 08/842,048

[22] Filed: Apr. 23, 1997

[30] Foreign Application Priority Data

Apr. 30, 1996 [JP] Japan .................................. 8-109326

[51] Int. Cl.⁶ .................................................. G21K 5/00
[52] U.S. Cl. .................................................. 378/34; 378/210
[58] Field of Search ................................................ 378/34

[56] References Cited

U.S. PATENT DOCUMENTS

| | | | |
|---|---|---|---|
| 5,131,022 | 7/1992 | Terashima et al. | 378/34 |
| 5,157,700 | 10/1992 | Kurosawa et al. | 378/34 |
| 5,222,112 | 6/1993 | Terasawa et al. | 378/34 |
| 5,268,951 | 12/1993 | Flamholz | 378/34 |
| 5,394,451 | 2/1995 | Miyake et al. | 378/34 |
| 5,503,950 | 4/1996 | Miyake et al. | 430/5 |
| 5,606,586 | 2/1997 | Amemiya et al. | 378/34 |

*Primary Examiner*—Craig E. Church
*Attorney, Agent, or Firm*—Fitzpatrick, Cella, Harper & Scinto

[57] ABSTRACT

An X-ray optical apparatus includes an illumination optical system, including (i) a deflection-scanning device for deflection-scanning an X-ray beam and (ii) a concave mirror for reflecting the deflection-scanned X-ray beam, for illuminating an object with the reflected X-ray beam, and a projection optical system for projecting an image of the object illuminated by the illumination optical system. Also disclosed is a device fabrication method for reduction-projecting a pattern of a mask onto a wafer to expose and transfer the pattern from the mask to the wafer.

9 Claims, 11 Drawing Sheets

X-RAY OPTICAL APPARATUS AND DEVICE FABRICATION METHOD

BACKGROUND OF THE INVENTION

1. Field of the Invention

The present invention relates to (i) an X-ray optical apparatus preferably used for an X-ray exposure system for fabricating a semiconductor device and (ii) an X-ray microscope system.

2. Description of the Related Art

The X-ray exposure method is one of the methods for fabricating a micro device, such as a semiconductor circuit device, having a fine pattern. In the case of this method, a mask having a circuit pattern formed thereon is illuminated with X-rays, the image of the mask is reduction-projected onto the surface of a wafer, and a resist on the wafer surface is exposed to transfer the circuit pattern from the mask.

FIG. 11 is a schematic block diagram of a conventional X-ray exposure system. In FIG. 11, reference numeral 901 denotes an undulator light source for emitting a light beam such as an X-ray beam, 903 denotes an X-ray beam emitted by the light source 901, 904 denotes a total reflection mirror, 909 denotes a reflection-type mask, 910 denotes a mask stage, 911 denotes a projection optical system, 912 denotes a wafer, 913 denotes a wafer stage, and 916 denotes a vacuum vessel for containing the aforementioned elements in a vacuum ambience.

This exposure system comprises the undulator light source 901 serving as an X-ray source, the total reflection mirror 904 serving as an illumination optical system, the reflection-type mask 909, the stage 910 with the reflection-type mask 909 mounted on it, the projection optical system 911, the wafer 912, the stage 913 with the wafer 912 mounted on it, an alignment mechanism for accurately and relatively adjusting the position of the mask 909 and the wafer 912, the vacuum vessel 916 for keeping the entire exposure system in a vacuum state, in order to prevent X-rays from attenuating, and an exhauster (not shown).

The undulator light source 901 constitutes an X-ray source. The undulator light source 901 emits so-called pencil-beam-like X-rays 903 which are thin and parallel. The X-rays 903 are reflected by the total reflection mirror 904 to cut short-wavelength components and form the X-rays into an almost-monochromatic X-ray beam 905, and apply the beam 905 to the reflection-type mask 909. The light emitting point of the undulator light source 901 is close to a point light source, because it has a size of approximately a few hundreds of microns. Therefore, the spread of the angle of the X-rays applied to one point on the mask 909 is very small.

The reflection-type mask 909 is provided with an X-ray reflection film pattern corresponding to a circuit pattern to be transferred and X-rays incident on the mask are reflected and led to the projection optical system 911. Then, the image of the circuit pattern of the reflection-type mask 909 is reduction-projected onto the surface of the wafer 912 to expose the resist. The projection optical system 911 comprises a plurality of multilayer-film reflection mirrors to reduction-project a pattern on the mask 909 onto the surface of the wafer 912. The projection optical system 911 normally uses a telecentric system.

However, an illumination optical apparatus used for a conventional X-ray exposure system has the following drawbacks, which need to be improved. That is, when a very fine pattern on a mask is projected onto a wafer, the resolution and the focal depth are insufficient and therefore, it is impossible to transfer a pattern at an accuracy necessary for the fabrication of a next-generation device. Moreover, even when a phase shift mask is used, it is impossible to adequately obtain the desired imaging performance, which should be improved by using the phase shift mask. The reason for this is described below.

A coherence factor a is one of the parameters for demonstrating the characteristics of an illumination system. When it is assumed that the numerical aperture at the mask side of a projection optical system is NApI and the numerical aperture at the mask side of an illumination optical system is NAi, the coherence factor is defined by the following expression:

$$\sigma = NAi/NApi.$$

The optimum value of the coherence factor a is determined by necessary resolution and contrast. In general, an interference pattern appears at the edge of the image of a fine pattern projected onto a wafer when the coherence factor $\sigma$ is too small, but the contrast of a projected image lowers when the coherence factor $\sigma$ is too large.

The case of the coherence factor $\sigma$ being 0 is referred to as coherent illumination. In this case, the optical transfer function (OTF) of an optical system shows a relatively large constant value up to a spatial frequency given by $NAp2/\lambda$ by assuming the numerical aperture at the wafer side of a projection optical system to be NAp2 and the X-ray wavelength of the optical system to be $\lambda$. However, the OTF becomes 0 for a high frequency exceeding the spatial frequency and therefore, the fine pattern cannot be resolved. The case of $\sigma$ being 1 is referred to as incoherent illumination. In this case, the OTF decreases as the spatial frequency increases, but it does not become 0 up to a spatial frequency given by $2 \times NAp2/\lambda$. Therefore, it is possible to resolve up to a finer pattern. To transfer a pattern having a structure larger than a diffraction limit, it is preferable that the coherence factor a has a value closer to that providing coherent illumination. Moreover, also when a phase shift mask is used, the effect of the improved imaging performance may adequately be obtained when the coherence factor $\sigma$ has a value closer to that providing coherent illumination. However, to transfer a pattern having a fine structure close to the diffraction limit, it is preferable that the coherence factor $\sigma$ has a value closer to that providing incoherent illumination, from the viewpoint of contrast.

In the case of the conventional example discussed above, the coherence factor $\sigma$ has a value almost equal to the condition of the coherent illumination because the spread of the angle of X-rays for illuminating one point on a mask is very small and the value of the coherence factor $\sigma$ is close to 0. Therefore, there is a disadvantage that a fine pattern cannot be transferred. The present invention is made to solve at least this problem.

SUMMARY OF THE INVENTION

It is an object of the present invention to provide (i) an X-ray optical apparatus having an illumination optical system capable of performing incoherent illumination and maximizing the performance of an imaging system for the incoherent illumination and (ii) a device fabrication method.

In one aspect, an X-ray optical apparatus of the present invention comprises means for deflection-scanning an X-ray beam and a concave mirror for reflecting the deflection-scanned X-ray beam.

In another aspect, an X-ray optical apparatus of the present invention comprises an illumination optical system, which includes (i) means for deflection-scanning an X-ray beam and (ii) a concave mirror for reflecting the deflection-scanned X-ray beam, for illuminating an object with the reflected X-ray beam, and a projection optical system for projecting an image of the object illuminated by the illumination optical system.

The object can be a mask having a pattern, and the image of the pattern can be reduction-projected onto a wafer by the projection optical system.

Also, the object can be an observation sample, in which case an image of the sample can be enlargement-projected on an observation surface by the projection optical system.

Furthermore, the means for performing deflection scanning and the object to be illuminated can be arranged in a conjugate relationship with each other, in relation to a concave mirror.

Furthermore, the X-ray beam can be an almost parallel beam generated by a pencil-beam X-ray source.

Still further, the X-ray optical apparatus can include a reflection-type integrator for forming a plurality of light source images.

As one alternative, the means for performing deflection scanning includes two grazing incident mirrors.

As another alternative, the means for performing deflection scanning includes an almost-normal incident mirror.

As still another alternative, the means for performing deflection scanning includes a pseudo-conical internal mirror.

In yet another aspect, a device fabrication method of the present invention comprises the steps of deflection-scanning an X-ray beam, reflecting the deflection-scanned X-ray beam by a concave mirror to illuminate a mask having a pattern and reduction-projecting the pattern of the mask onto a wafer to perform exposure transfer of the mask pattern to the wafer.

The present invention overcomes the disadvantages of the prior art in which the value of the coherence factor σ of an illumination optical system is close to 0 and almost causes the conditions of coherent illumination, so that a fine pattern cannot be transferred, as discussed below.

In the present invention, a pencil-like X-ray beam is reflected by a mirror, which is capable of angular variations, to scan the beam at a desired angle. The beam is reflected by a reflection optical system to illuminate a mask. The reflection optical system is arranged so that the distribution angle of the scanned X-rays corresponds to the distribution angle of X-rays incident on a mask. The specific structure of this optical system is described in detail in embodiments of the present invention.

Because the distribution angle of the X-rays incident on the mask corresponds to the distribution angle of the scanned X-rays, the distribution angle of the X-rays incident on the mask is decreased by decreasing the angle for scanning the X-rays. Conversely, by increasing the angle for scanning the X-rays, the distribution angle of the X-rays incident on the mask increases. Moreover, by making the distribution angles for scanning the X-rays non-uniform, the distribution angle of the X-rays incident on the mask becomes non-uniform and thus, deformed illumination is achieved.

Therefore, in the present invention, by angle-scanning an X-ray beam and properly setting the distribution angle of the X-ray beam, the distribution angle of the X-ray beam illuminating an object can be controlled, the coherence factor σ of an illumination optical system can freely be adjusted, and deformed illumination, such as zonal illumination or oblique illumination can be provided. Because illumination can be made under optimum illumination conditions corresponding to exposure conditions, such as the shape or size of a pattern or resist characteristics, the imaging performance such as resolution and focal depth can be improved. Moreover, because illumination can be made under optimum illumination conditions even when using a phase shift mask, the effect of improved imaging performance, which should be achieved when using a phase shift mask, can adequately be obtained.

Moreover, by angle-scanning an X-ray beam and properly setting the distribution angle of the X-ray beam, the distribution angle of X-rays illuminating an observation sample can be controlled, the coherence factor σ of an illumination optical system can freely be adjusted, and deformed illumination, such as zonal illumination or oblique illumination can be provided. Because illumination can be made under optimum conditions corresponding to the contrast of a sample to be observed or the characteristics of an X-ray imaging apparatus, it is possible to improve the imaging performance such as resolution and focal depth, and to observe an image at a high resolution.

Moreover, by using a reflection-type integrator, it is possible to illuminate a wide region uniformly.

DESCRIPTION OF THE PREFERRED EMBODIMENTS

The preferred embodiments of the present invention are described below by referring to the accompanying drawings.

(First embodiment of the invention)

Figure 1:
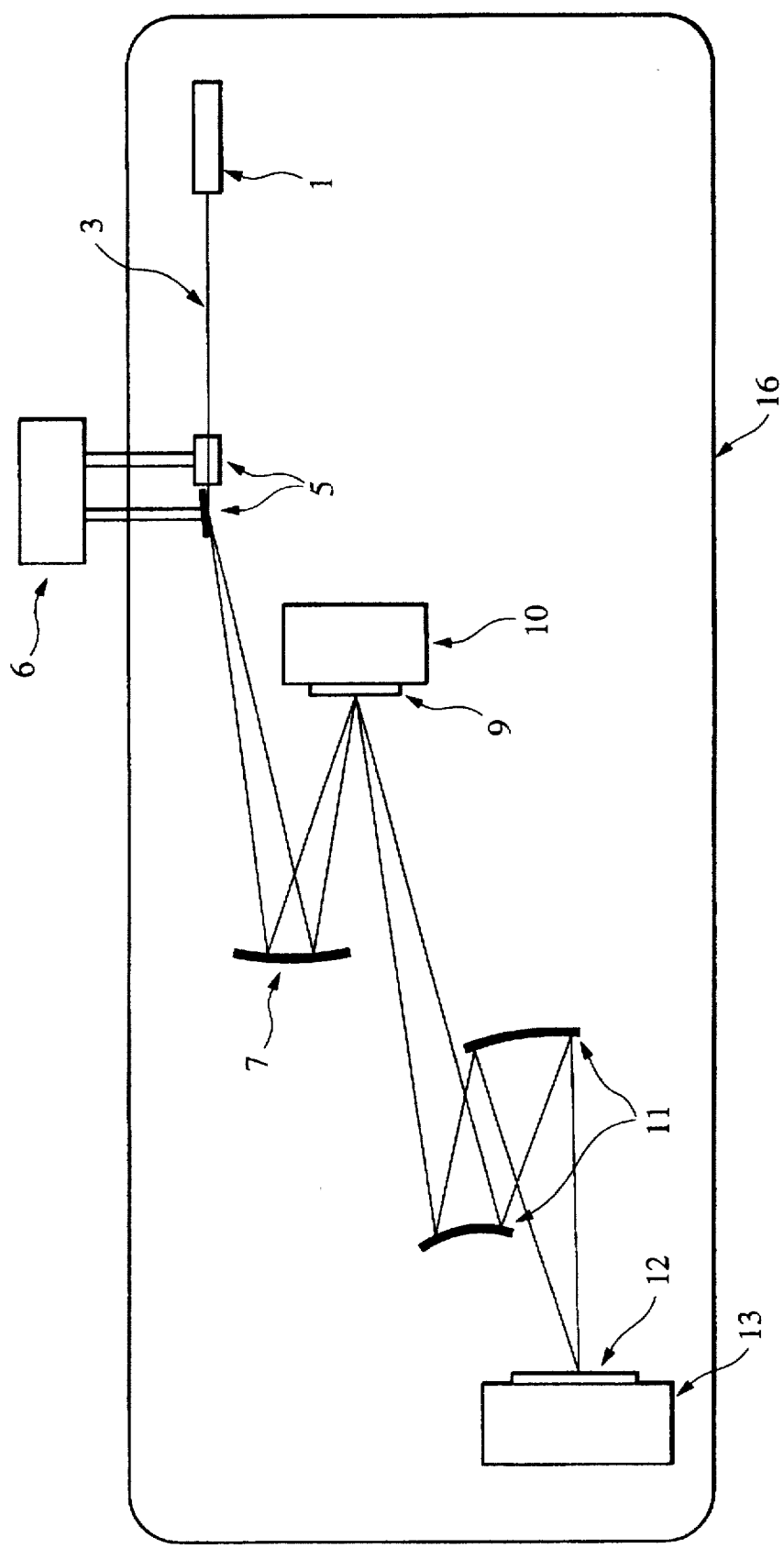
FIG. 1 is a schematic block diagram of the X-ray exposure system of a first embodiment of the present invention.
Figure 2:
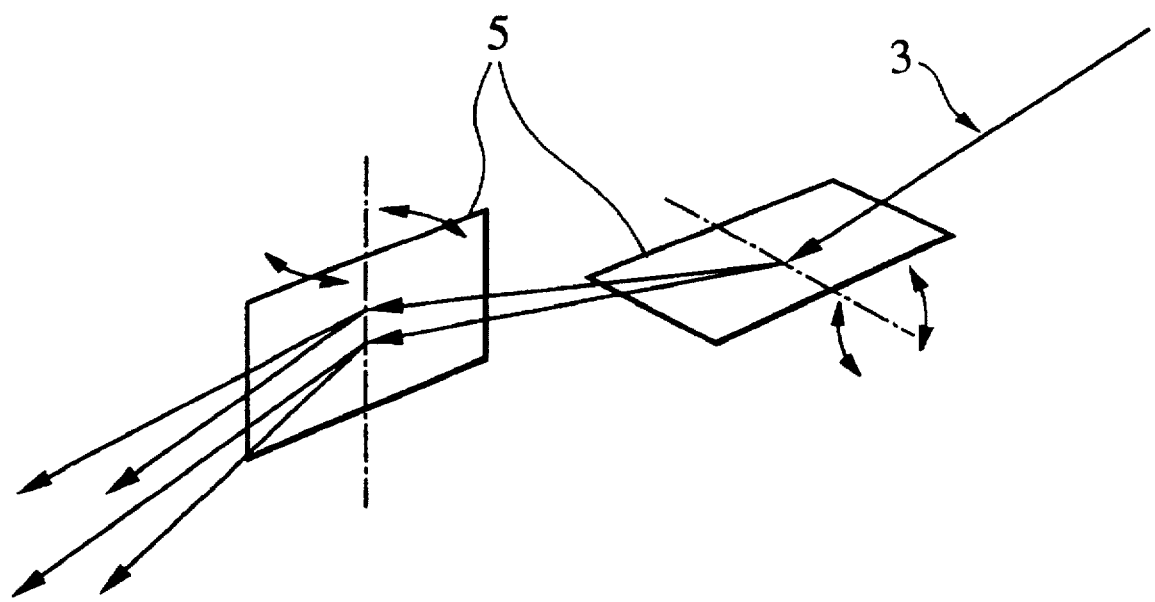
FIG. 2 is a schematic perspective view of a beam deflection mirror of the first embodiment of the present invention.

FIG. 1 is a schematic block diagram of the X-ray exposure system of the first embodiment of the present invention, FIG. 2 is a schematic perspective view of a beam deflection mirror of the first embodiment of the present invention, and FIGS. 3A to 3I are beam deflection patterns of the first embodiment of the present invention. In FIG. 1, reference numeral 1 denotes an undulator light source for emitting a light beam such as an X-ray beam, 3 denotes an X-ray beam emitted by the light source 1, 5 denotes beam deflection mirrors, 6 denotes a deflection mirror driver, 7 denotes a concave mirror, 9 denotes a reflection-type mask, 10 denotes a mask stage, 11 denotes a projection optical system, 12 denotes a wafer, 13 denotes a wafer stage, and 16 denotes a vacuum vessel.

This embodiment comprises the undulator light source 1 for generating an X-ray parallel pencil beam, two beam deflection mirrors 5 serving as vibration mirrors and the deflection mirror driver 6 serving as a mechanism for driving the mirrors 5, the concave mirror 7, the reflection-type mask 9 and the mask stage 10, serving as an inching stage for positioning the reflection-type mask 9, the projection optical system 11, the wafer stage 13, serving as an inching stage for positioning the wafer 12 coated with the resist, and the vacuum vessel 16 for containing the entire exposure system in a vacuum ambience.

The beam deflection mirrors 5, serving as a vibration mirror, are grazing-incident total reflection mirrors, which are angle-driven by a motor at a high speed from outside of the vacuum vessel through bellows and in which a beam is angle-scanned a plurality of times during one-time pattern transfer.

The projection optical system 11 comprises two a spherical reflection mirrors and its reflection surface is provided with a multilayer film. The projection optical system 11 uses a telecentric system. The image-side numerical aperture NAp2 of the projection optical system 11 is set in accordance with the working wavelength λ and necessary resolution and focal depth, which normally require a value of 0.05 to 0.2. When assuming the image-side numerical aperture NAp2 as 0.1 and a projection magnification as ⅕, the object (mask)-side numerical aperture NAp1 comes to 0.02.

The undulator light source 1 is provided with a shutter for turning on/off the output of a beam. As shown in FIG. 2, the pencil-like X-ray beam 3 emitted from the light source 1 has a rotational axis for causing an X-ray beam to continuously angle-scan a plurality of times in two orthogonal directions during one irradiation time in the direction perpendicular to the X-ray beam, which is reflected by the two beam deflection mirrors 5, serving as vibration mirrors whose rotational axes are arranged perpendicular to each other, is angle-scanned, and enters the concave mirror 7, serving as a spheroidal mirror. The concave mirror 7 is set so that the beam deflection mirrors 5 are located at the first focus position of the mirror 7 and the reflection-type mask 9 is located at the second focus position of the mirror 7. Thereby, the reflection surfaces of the beam deflection mirrors 5 are in a conjugate relationship with the reflection surface of the reflection-type mask 9.

In this case, X-rays deflected to a desired angle illuminate the mask 9 at the desired angle. By deflecting the X-ray beam 3 in a manner to cause it to have a uniform angle distribution, the mask 9 is illuminated with X-rays having an almost uniform angular distribution.

When, assuming the distance between the beam deflection mirrors 5 and the concave mirror 7 is f1, the distance between the concave mirror 7 and the reflection-type mask 9 is f2, and the size of the distribution angle of the X-ray beam 3 deflected at a uniform angular distribution is d (rad), the opening of the angle of X-rays incident on one point on the mask 9 comes to d×f1/f2 (rad). Therefore, the numerical aperture NAi of the projection optical system becomes d×d1/(2×f2). In this case, the coherence factor σ comes to d×f1/(2×f2×NAp1). If d equals 0.01 rad when setting f1 to 2000 mm, f2 to 500 mm, and NAp1 to 0.02, the coherence factor σ approaches 1.0, and incoherent illumination is realized.

Moreover, by deflecting the X-ray beam 3 with a non-uniform distribution angle and by synchronizing the on/off timing of the shutter of the light source 1, the mask 9 is illuminated with X-rays having a non-uniform angle distribution and so-called "deformed illumination" can be realized. Furthermore, by greatly increasing a deflection speed in regions other than a region to be illuminated, without using the shutter, it is possible to create a substantial non-illumination region.

Figure 3:
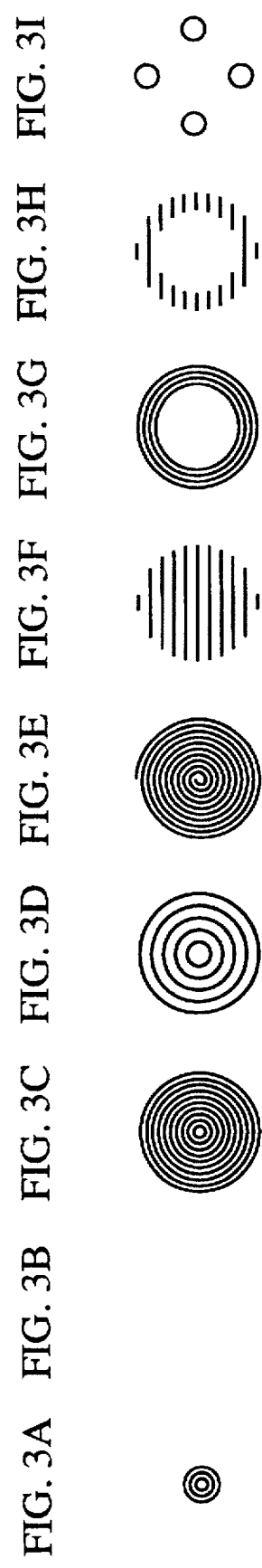
FIGS. 3A to 3I are beam deflection patterns of the first embodiment of the present invention.

FIGS. 3A to 3I show deflection angle distributions. By decreasing a deflection angle as shown in FIG. 3A or performing no deflection at all as shown in FIG. 3B, the coherence factor a becomes close to 0 and coherent illumination is realized. By generating concentric circles with different diameters, as shown in FIG. 3C, so that a deflection angle distribution becomes uniform, the coherence factor σ becomes close to 1 and incoherent illumination is realized. Also, by scanning concentric circles at intervals as shown in FIG. 3D, incoherent illumination is almost realized. Moreover, by spirally performing scanning as shown in FIG. 3E or generating scanning-like parallel lines, as shown in FIG. 3F, a similar effect is obtained. Furthermore, by annularly performing deflection, as shown in FIGS. 3G and 3H or generating deflection-like discrete spots as shown in FIG. 3I and thereby deviating the distribution angle of the X-rays approaching the mask 9 from a uniform distribution, the so-called "deformed illumination" can be realized and the imaging performance, such as resolution and focal depth can be improved.

Thus, in the case of this embodiment, by angularly scanning the X-ray beam 3, it is possible to increase the coherence factor. Moreover, it is possible to control the distribution angle of the X-rays illuminating the mask 9 by changing angle distributions to be scanned and moreover, to set the coherence factor of an illumination optical system to an optimum value, and perform deformed illumination, such as zonal illumination or oblique illumination. Because it is possible to perform illumination under optimum illumination conditions corresponding to exposure conditions, it is possible to improve the imaging performance, such as resolution and focal depth. Moreover, when using a phase shift mask, it is possible to obtain the effects of improved imaging performance, which should be achieved when using a phase shift mask.

(Second embodiment of the invention)

Figure 4:
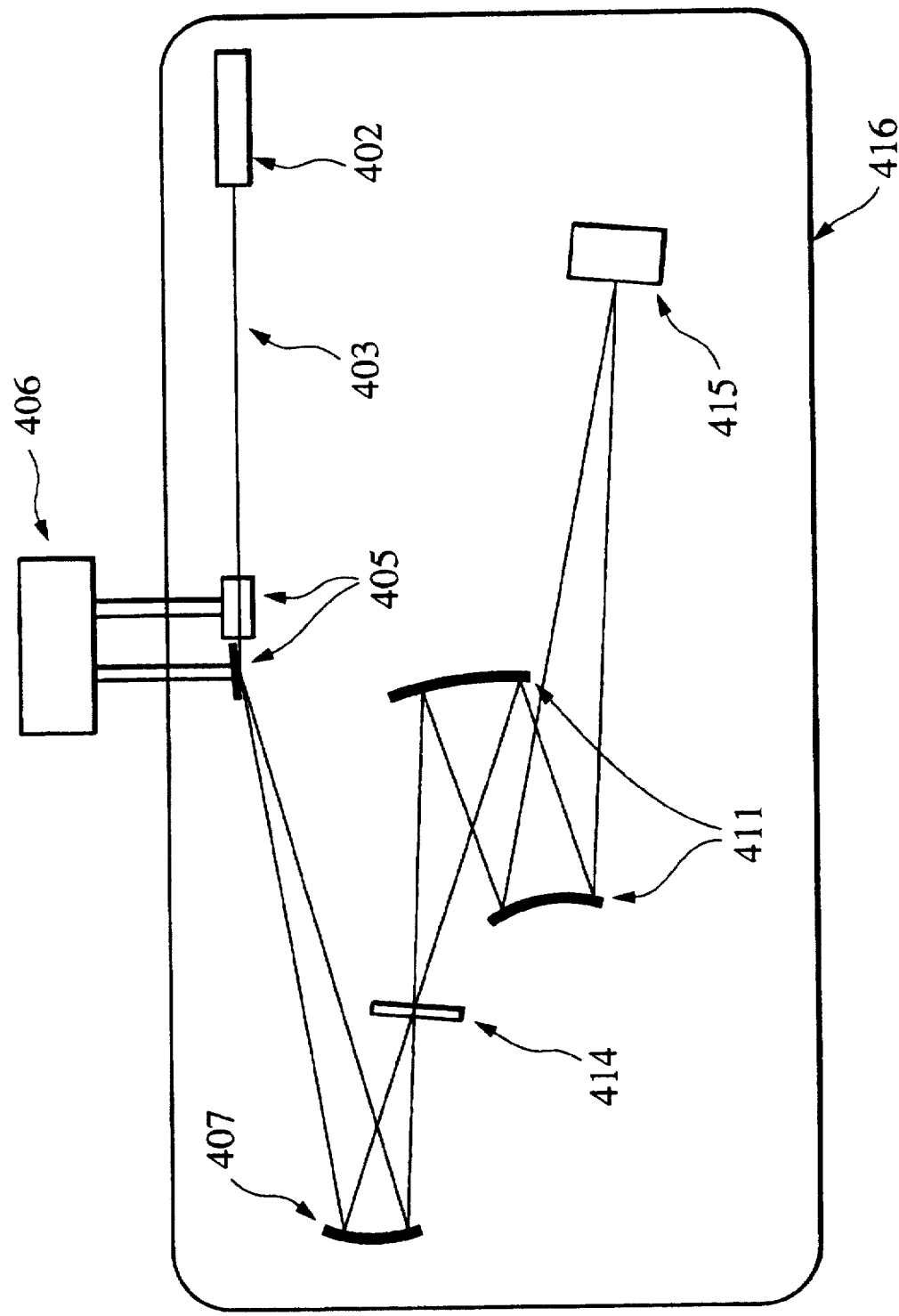
FIG. 4 is a schematic block diagram of the X-ray step and repeat exposure system of a second embodiment of the present invention.

FIG. 4 is a schematic block diagram of an X-ray microscope system of a second embodiment of the present invention, in which reference numeral 402 denotes a synchrotron radiation light source having a beam-output on/off shutter, 403 denotes an X-ray beam, 405 denotes beam deflection mirrors, 406 denotes a deflection mirror driver, 407 denotes a concave mirror, 411 denotes a projection optical system, 414 denotes an observation sample, 415 denotes an X-ray imaging apparatus, and 416 denotes a vacuum vessel. This embodiment represents an example of applying an optical apparatus of the present invention to an X-ray microscope. This embodiment comprises the synchrotron radiation light source 402 for generating an X-ray sheet beam, two beam deflection mirrors 405 serving as vibration mirrors, the concave mirror 407, the sample 414 to be observed, the enlargement projection optical system 411, the two-dimensional imaging apparatus 415 for observing an X-ray image, and the vacuum vessel 416 for containing the entire system in a vacuum ambience. The two-dimensional imaging apparatus 415 uses a CCD, a microchannel plate, an imaging plate, or a resist.

The beam deflection mirrors 405, serving as vibration mirrors are grazing incident mirrors, which are angle-driven by a motor at a high speed from outside of the vacuum vessel through bellows and in which the X-ray beam 403 is angle-scanned during one image capture. Similar to the first embodiment, it is possible to perform coherent illumination, incoherent illumination, or deformed illumination by scanning the X-ray beam 403 using the beam deflection mirrors 405.

Therefore, in this embodiment, by angle-scanning the synchrotron X-ray beam 403 and properly setting the distribution angle of the beam 403, it is possible to control the angle distribution of the X-rays illuminating the observation sample 414, to set the coherence factor σ of an illumination optical system to an optimum value, and to perform deformed illumination, such as zonal illumination or oblique illumination. Because the sample 414 to be observed can be illuminated under optimum illumination conditions corresponding to the contrast of the sample 414 or the characteristics of the X-ray imaging apparatus 415, it is possible to improve the imaging performance, such as resolution and focal depth and to observe an image at a high resolution.

(Third embodiment of the invention)

Figure 5:
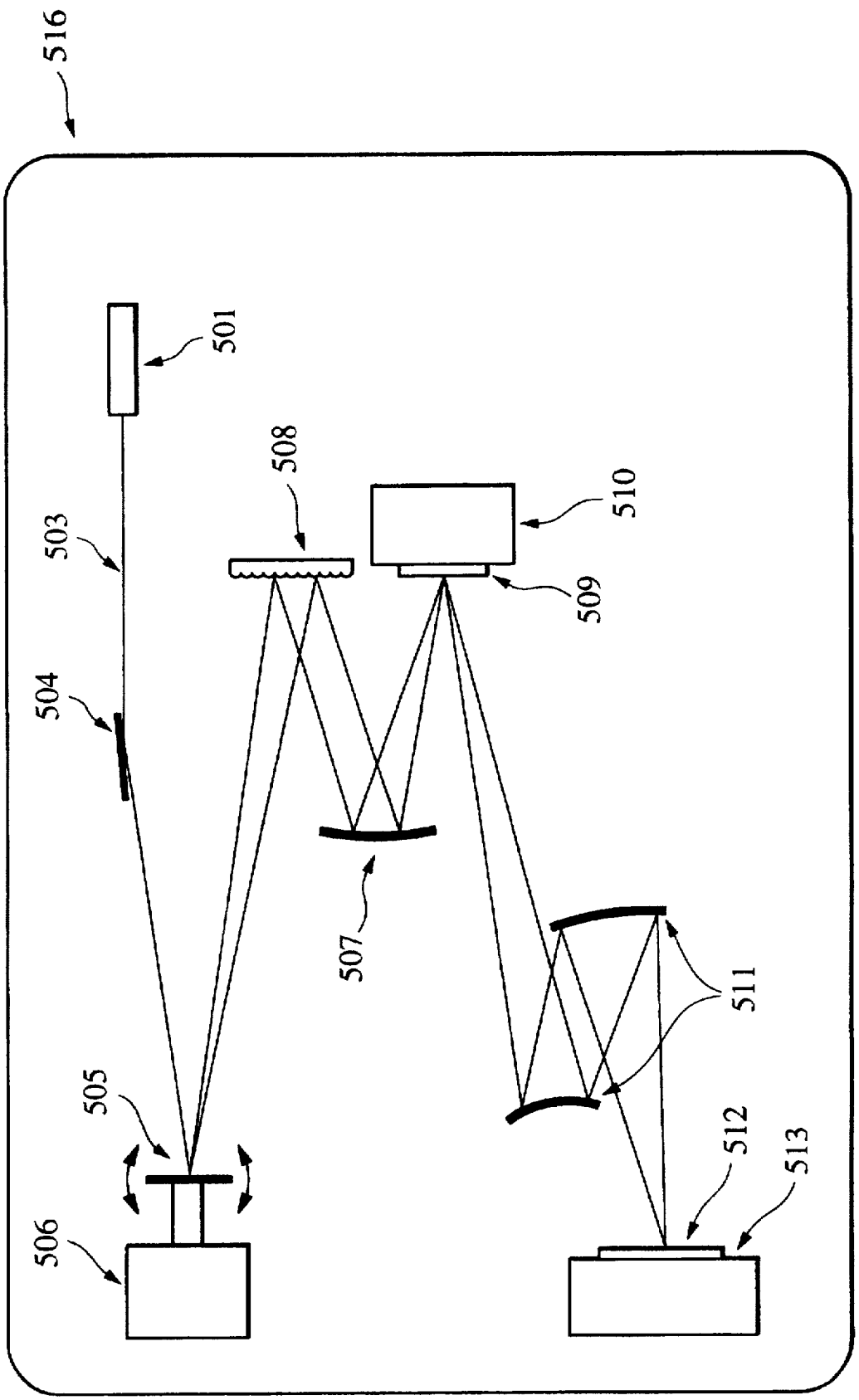
FIG. 5 is a schematic block diagram of the X-ray exposure system of a third embodiment of the present invention.
Figure 6:
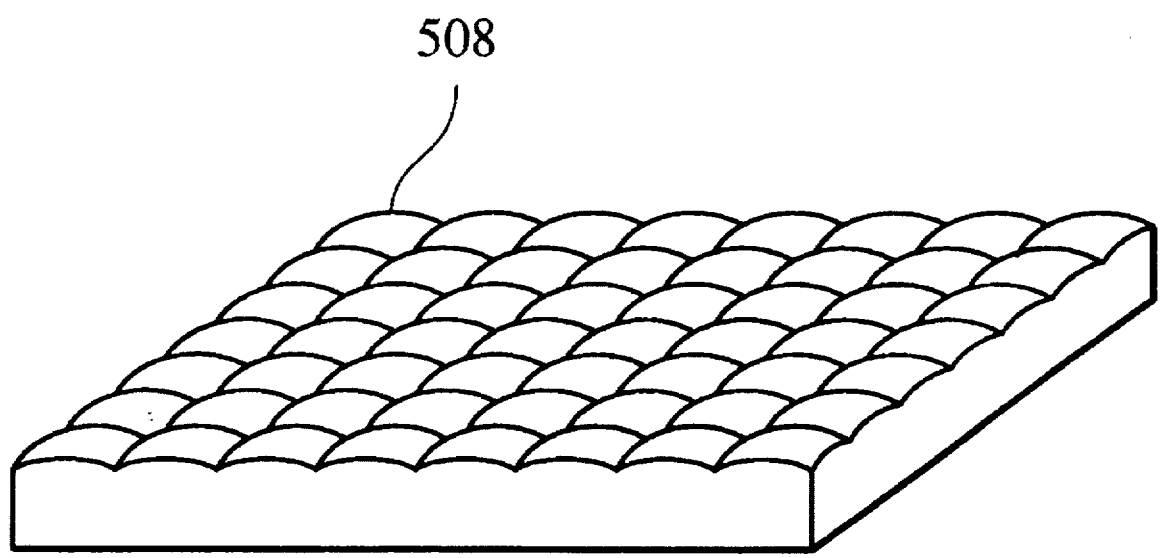
FIG. 6 is a schematic perspective view of a reflection-type integrator of the third embodiment of the present invention.

FIG. 5 is a schematic block diagram of an X-ray exposure system of a third embodiment of the present invention and FIG. 6 is a schematic perspective view of a reflection-type integrator of the third embodiment of the present invention. In FIG. 5, reference numeral 501 denotes an undulator light source, having a beam-output on/off shutter, for emitting a light beam such as an X-ray beam, 503 denotes a pencil-like X-ray beam emitted by the light source 501, 504 denotes a total reflection mirror, 505 denotes a beam deflection mirror, 506 denotes a deflection mirror driver, 507 denotes a concave mirror, 508 denotes a reflection-type integrator, 509 denotes a reflection-type mask, 510 denotes a mask stage, 511 denotes a projection optical system, 512 denotes a wafer, 513 denotes a wafer stage, and 516 denotes a vacuum vessel.

This embodiment comprises the undulator light source 501, serving as an X-ray source, an illumination optical system including the beam deflection mirror 505, serving as a vibration mirror, and the reflection-type integrator 508, the reflection-type mask 509, the projection optical system 511, the stage 510 with the mask 509 mounted on it, the wafer 512, the stage 513 with the wafer 512 mounted on it, an alignment mechanism for accurately adjusting the positions of the mask 509 and the wafer 512, the vacuum vessel 516 for containing the entire optical system in a vacuum ambience in order to prevent X-rays from attenuating, and an exhauster (not shown).

The pencil-like X-ray beam 503 emitted from the undulator light source 501 is reflected by the total reflection mirror 504 to cut short wavelength components such as harmonics and is reflected by the beam deflection mirror 505, serving as a vibration mirror. The surface of the vibration mirror 505 is provided with a multilayer reflection film and X-rays are almost normally incident on the surface thereof. The vibration mirror 505 is supported by an elastic body such as a metallic spring. By using a combination of an electromagnetic device such as a coil through which alternating current flows with a permanent magnet and thereby vibrating the elastic body, it is possible to vibrate the vibration mirror at a high frequency.

The X-ray beam 503 angle-scanned by the mirrors 504 and 505 is reflected by the reflection-type integrator 508 to form a plurality of secondary light sources. The reflection-type integrator 508 uses a fly's-eye mirror in which many very small convex or concave surfaces are two-dimensionally arranged, as shown in FIG. 6.

X-rays emitted from the secondary light sources of the reflection-type integrator 508 are reflected by the concave mirror 507, serving as a spheroidal mirror, to illuminate the mask 509. The distance between the secondary light sources and the concave mirror 507 and the distance between the concave mirror 507 and the mask 509 are set to be equal to the focal distance of the concave mirror 507. That is, because the focus of the concave mirror 507 is located at the position of the secondary light sources, X-rays emitted from one of the secondary light sources illuminate a wide region on the mask 509 in the form of parallel rays. The projection optical system 511 uses a telecentric system. Therefore, images of the secondary light sources are projected on the pupil plane of the projection optical system 511 and thus, the conditions of Koehler illumination are satisfied. X-rays illuminating a certain point on the mask 509 are rays formed by superposing the X-rays emitted from all of the secondary light sources.

Therefore, this embodiment makes it possible to increase the coherence factor by angle-scanning the X-ray beam 503. Moreover, this embodiment makes it possible to control the distribution angle of the X-rays for illuminating the mask 509 by changing the angle distributions to be scanned, to set the coherence factor of the illumination optical system to an optimum value, corresponding to a transfer pattern, and to perform deformed illumination, such as zonal illumination or oblique illumination. Because the optical apparatus of this embodiment makes it possible to perform illumination under optimum illumination conditions corresponding to exposure conditions, it is possible to improve the imaging performance, such as resolution and focal depth. Moreover, when using a phase shift mask, it is possible to obtain the effects of improved imaging performance, which should be achieved when using a phase shift mask.

Moreover, this embodiment makes it possible to uniformly illuminate a wide region on the mask 509 by using the reflection-type integrator 508. Therefore, it is possible to transfer a large pattern region at one time. Furthermore, because the beam deflection mirror 505, serving as a vibration mirror, is vibrated by supporting it by an elastic body, it is possible to deflect the X-ray beam 503 at a high speed.

(Fourth embodiment of the invention)

Figure 7:
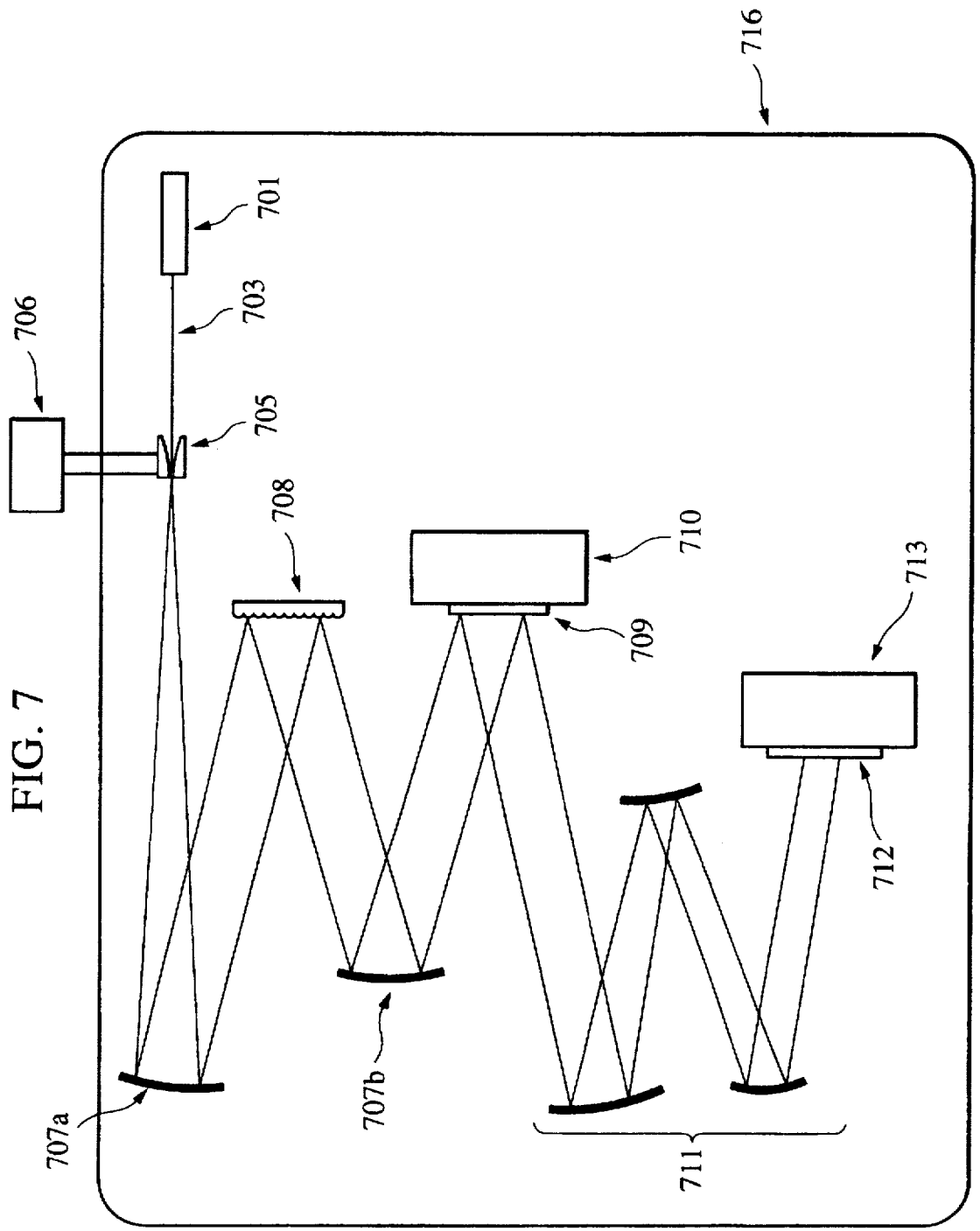
FIG. 7 is a schematic block diagram of the X-ray exposure system of a fourth embodiment of the present invention.
Figure 8A:
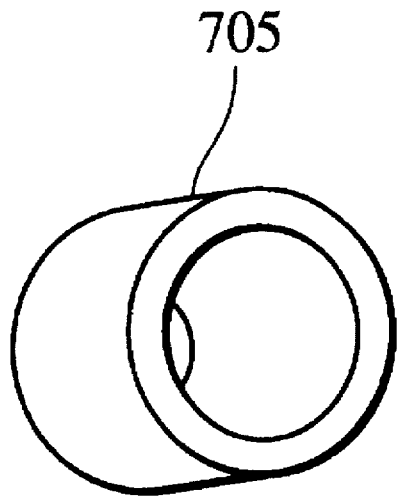
FIGS. 8A and 8B are perspective and schematic views, respectively, of a beam deflection mirror of the fourth embodiment of the present invention.
Figure 8B:
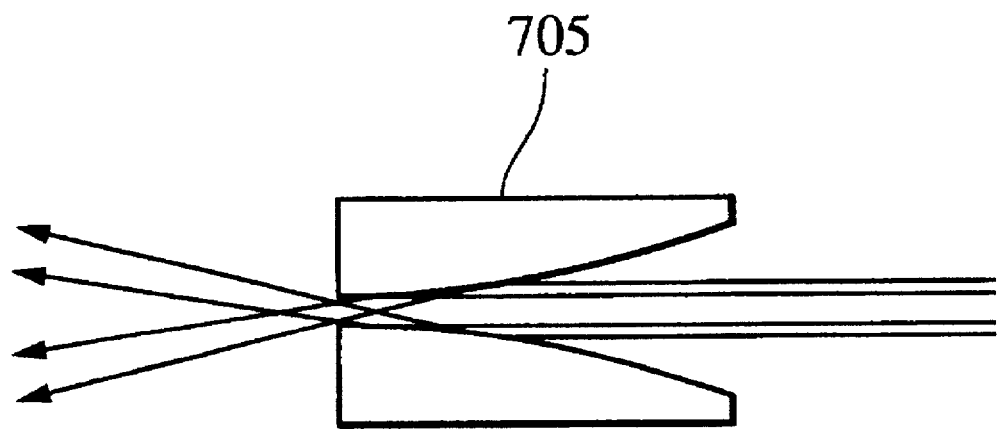

FIG. 7 is a schematic block diagram of an X-ray exposure system of a fourth embodiment of the present invention and FIGS. 8A and 8B are perspective and schematic views, respectively, of a beam deflection mirror used in the fourth embodiment of the present invention. In FIG. 7, reference numeral 701 denotes an undulator light source, having a beam-output on/off shutter, for emitting a light beam such as an X-ray beam, 703 denotes an X-ray beam emitted by the light source 701, 705 denotes a beam deflection mirror, 706 denotes a deflection mirror driver, 707a and 707b denote concave mirrors, 708 denotes a reflection-type integrator, 709 denotes a reflection-type mask, 710 denotes a mask stage, such as an inching stage, 711 denotes a projection optical system, 712 denotes a wafer, 713 denotes a wafer stage, such as an inching stage, and 716 denotes a vacuum vessel.

This embodiment comprises the undulator light source 701, the beam deflection mirror 705, the concave mirrors 707a and 707b, the reflection-type integrator 708, the reflection-type mask 709 and the mask stage 710 for positioning the mask 709, the projection optical system 711, the wafer 712, which is coated with a resist and wafer stage 713 for positioning the wafer 712, and the vacuum vessel 716 for containing the entire system in a vacuum ambience.

The beam deflection mirror 705 is a grazing incidence total deflection mirror, having a rotation-symmetric pseudo-conical internal shape using a convex curve as a bus line, as shown in FIGS. 8A and 8B. This mirror is driven by a motor at a high speed through bellows from outside of the vacuum vessel 716 so that it is translated while keeping its axis of symmetry parallel to an incoming beam. The projection optical system 711 comprises three a spherical reflection mirrors and its reflection plane is provided with a multilayer film. The projection optical system 711 uses a telecentric system.

The pencil-like X-ray beam 703 emitted from the undulator light source 701 is reflected and angle-scanned by the deflection mirror 705 and is incident on the concave mirror 707a. The concave mirror 707a is set so that the deflection mirror 705 is located at the focus position of the mirror 707a. In this case, X-rays deflected to a different angle are made parallel by the concave mirror 707a and enter the reflection-type integrator 708 at a different position.

The X-rays reflected on the reflection-type integrator 708 form many secondary light sources. The reflection-type integrator 708 uses a fly's-eye mirror in which many very small convex or concave surfaces are two-dimensionally arranged, similar to the case of the third embodiment.

The X-rays emitted from the secondary light sources of the reflection-type integrator 708 are reflected by the concave mirror 707b, serving as a spheroidal mirror, to illuminate the mask 709. The distance between the secondary light sources and the concave mirror 707b and the distance between the concave mirror 707b and the mask 709 are set to be equal to the focal distance of the concave mirror 707b. That is, the focus of the concave mirror 707b is located at the position of incidence of the secondary light source, and the X-rays emitted from one of the secondary light sources illuminate a wide region of the mask 709 with parallel rays.

The projection optical system 711 uses a telecentric system. Therefore, the images of the secondary light sources are projected on the incident pupil plane of the projection optical system 711 and thus, the conditions of Koehler illumination are satisfied. X-rays illuminating a certain point on the mask 709 are rays formed by superposing the X-rays emitted from all of the secondary light sources. The beam deflection angular distribution generated by the deflection mirror 705 corresponds to the spatial distribution of the secondary light sources, and moreover, corresponds to the distribution angle of the X-rays for illuminating a certain point on a mask. Therefore, it is possible to freely change coherence factors by changing the range of distribution of the deflection angles. Moreover, by changing the distribution of the deflection angles into a non-uniform distribution as an annular distribution, it is possible to realize deformed illumination.

Therefore, this embodiment makes it possible to increase the coherence factor by angle-scanning the X-ray beam 703 by the beam deflection mirror 705, having a pseudo-conical internal shape. Moreover, this embodiment makes it possible to control the distribution angle of the X-rays for illuminating the mask 709 by changing the angle distributions to be scanned, to set the coherence factor of an illumination optical system to an optimum value corresponding to a transfer pattern, and to perform deformed illumination, such as zonal illumination or oblique illumination. Because illumination can be made under optimum illumination conditions in accordance with exposure conditions, it is possible to improve the imaging performance such as resolution and focal depth. Moreover, when using a phase shift mask, it is possible to obtain the effects of improved imaging performance, which should be achieved when using a phase shift mask. Furthermore, because the beam deflection mirror 705 has a pseudo-conical internal shape, a beam angle can be deflected to an optional angle in two dimensions by translating one beam deflection mirror 705 in a plane and accurate beam deflection can be achieved by using a simple mirror driver.

As described above, by angle-scanning an X-ray beam by a beam deflection mirror and properly setting the distribution angle of the beam, advantages can be obtained such that it is possible to control the distribution angle of the X-rays for illuminating an object, to freely adjust the coherence factor σ of an illumination optical system, and to perform deformed illumination, such as zonal illumination or oblique illumination. Because illumination can be performed under optimum illumination conditions corresponding to exposure conditions, such as the shape or size of a pattern to be transferred, the characteristics of a resist, or the composition of an observation sample, it is possible to improve the imaging performance, such as resolution and focal depth. Moreover, illumination can be performed under optimum illumination conditions even when using a phase shift mask. Therefore, it is possible to obtain the effects of improved imaging performance, which should be achieved when using a phase shift mask.

When using a beam deflection mirror having a pseudo-conical internal shape, it is possible to deflect the angle of a beam to an optimum angle in two dimensions by translating one beam deflection mirror in one plane and to achieve an accurate beam deflection by a simple mirror driver.

Moreover, by using a reflection-type integrator, it is possible to uniformly illuminate a wide region.

<Embodiment of a device production method>

An embodiment of a device production method using the above-described aligner is described below.

Figure 9:
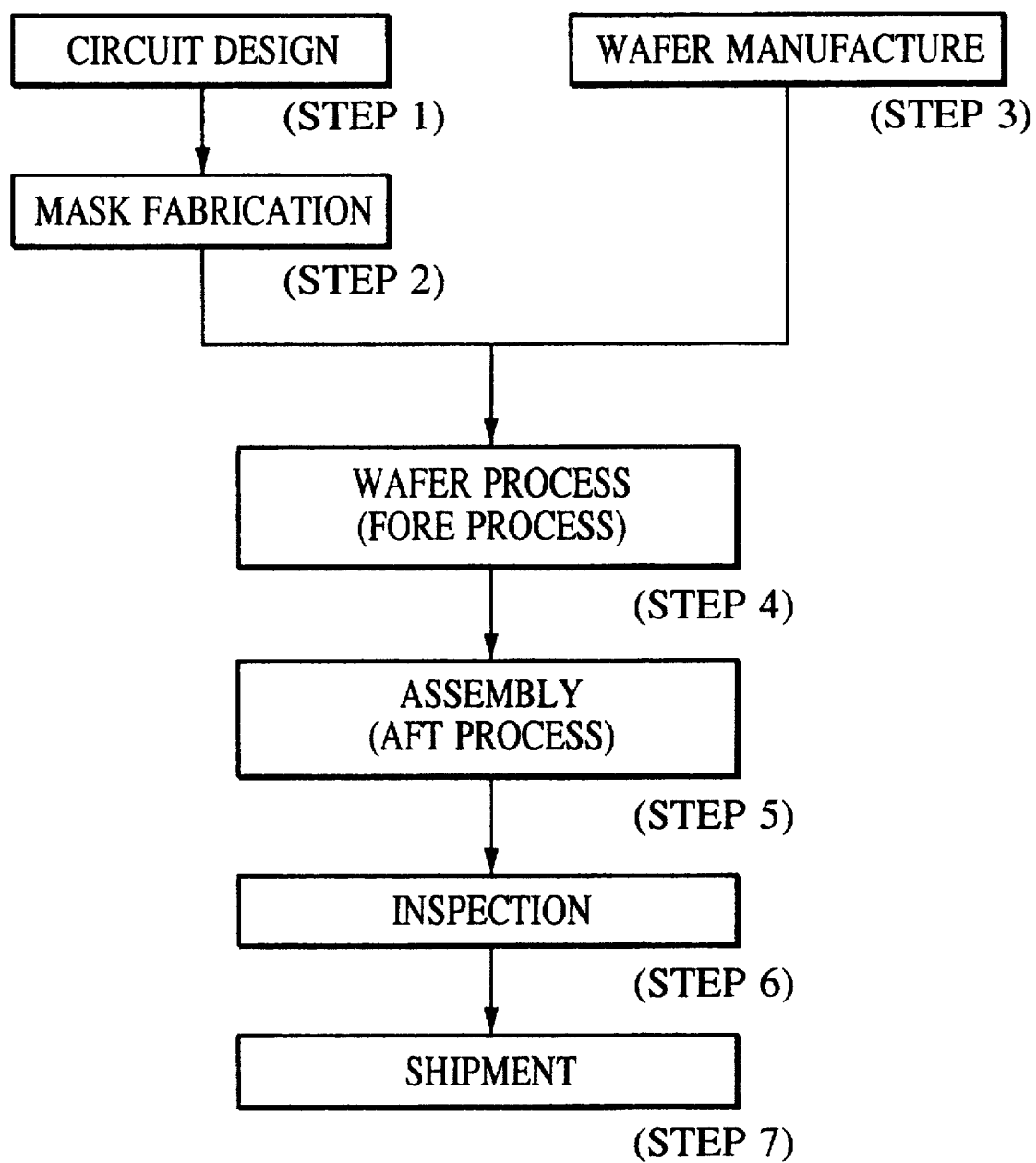
FIG. 9 is an illustration showing a semiconductor device fabrication flow chart.

FIG. 9 shows a flow chart for fabricating a micro-device (e.g., a semiconductor chip such as an IC or LSI, a liquid crystal panel, a CCD, a thin-film magnetic head, or a micromachine). In step 1 (circuit design), circuit design of a semiconductor device is performed. In step 2 (mask fabrication), a mask with a designed circuit pattern formed on it is fabricated. In step 3 (wafer manufacture), a wafer is manufactured by using a material such as silicon. Step 4 (wafer process) is referred to as a pre-process, in which an actual circuit is formed on the above prepared wafer through lithography by using the above prepared mask. The next step 5 (fabrication) is referred to as a post-process, in which a semiconductor chip is fabricated by using the wafer manufactured in step 4, and includes an assembly process (dicing and bonding) and a packaging process (chip sealing). In step 6 (inspection), inspections are performed including an operation checking test and a durability test of the semiconductor device fabricated in step 5. A semiconductor device is completed by passing through the above steps and then, is shipped (step 7).

Figure 10:
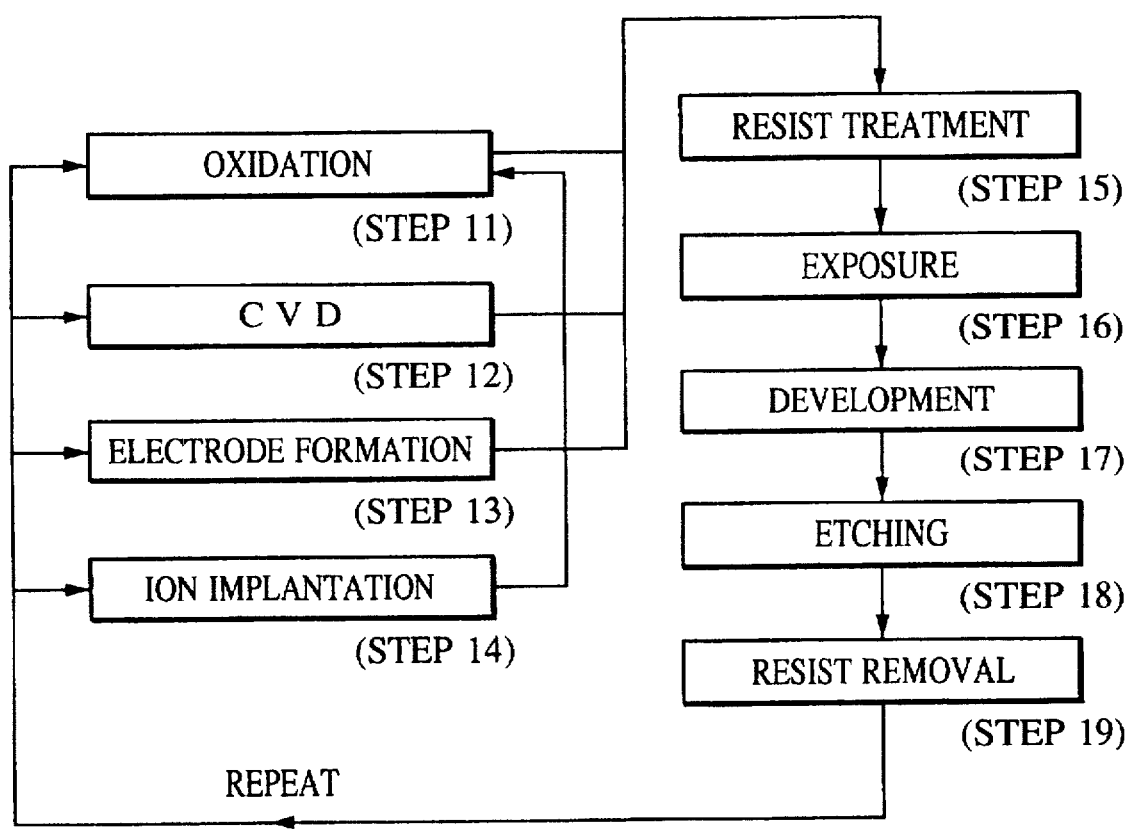
FIG. 10 is an illustration showing a detailed flow chart of a wafer process in the semiconductor device fabrication flow chart of FIG. 9.
Figure 11:
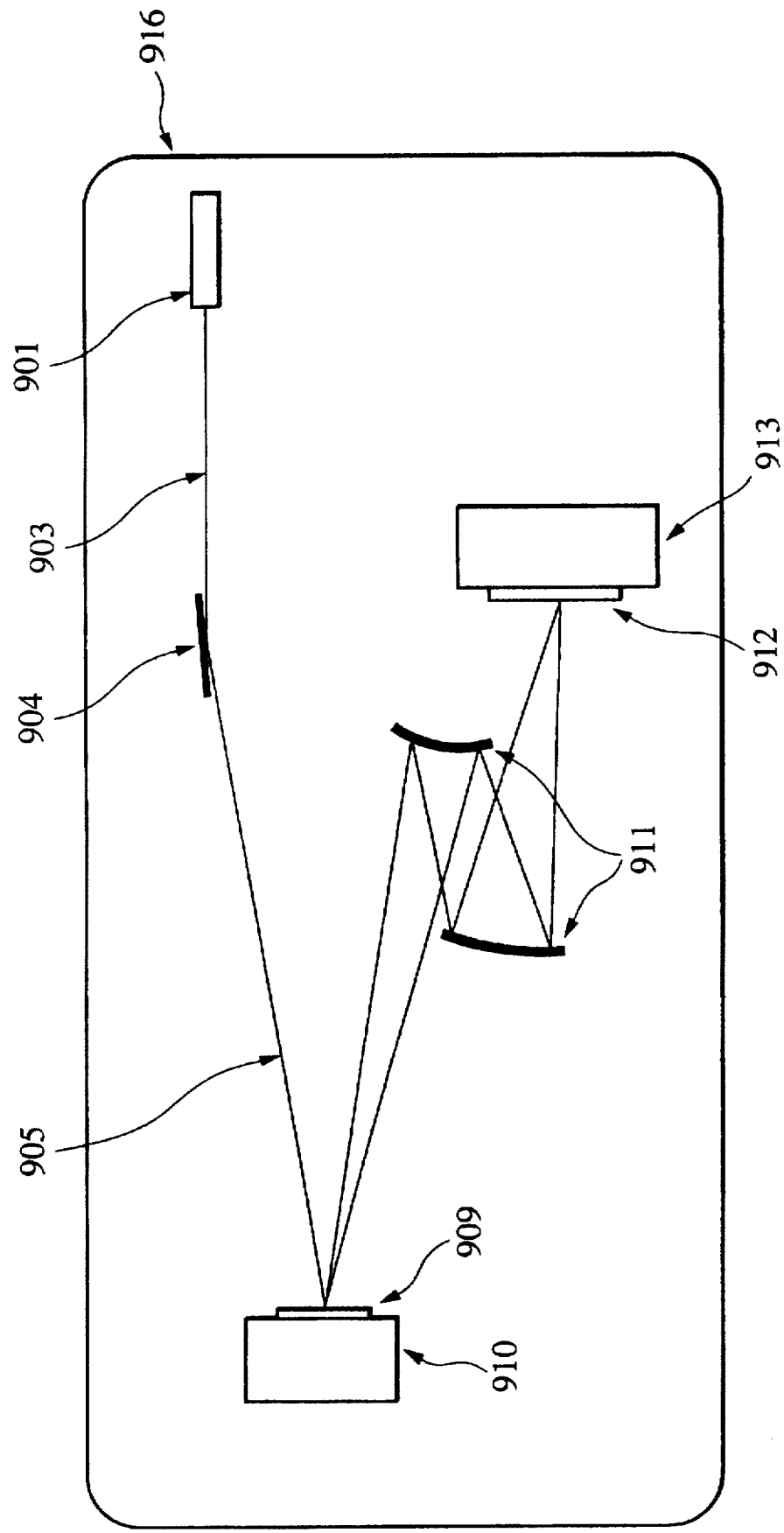
FIG. 11 is a schematic block diagram of a conventional exposure system.

FIG. 10 shows a detailed flow chart of the wafer process discussed above in step 4 shown in FIG. 9. In step 11 (oxidation), the surface of a wafer is oxidized In step 12 (CVD), an insulating film is formed on the wafer. In step 13

(electrode formation), an electrode is formed on the wafer through vacuum deposition. In step 14 (ion implantation), ions are implanted into the wafer. In step 15 (resist treatment), a photosensitive material is applied to the wafer. In step 16 (exposure), a circuit pattern of a mask is printed on the wafer to expose the pattern using the above-described aligner. In step 17 (development), the exposed wafer is developed. In step 18 (etching), portions other than a developed resist image are etched. In step 19 (resist removal), unnecessary resist after etching is removed. By repeating the above steps, circuit patterns are multiply formed on the wafer.

Except as otherwise disclosed herein, the various components shown in outline or in block form in the figures are individually well known and their internal construction and operation is not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An X-ray optical apparatus comprising:

illumination optical system, comprising (i) deflection-scanning means for deflection-scanning an X-ray beam and (ii) a concave mirror for reflecting the deflection-scanned X-ray beam, for illuminating an object with the reflected X-ray beam; and a projection optical system for projecting an image of the object illuminated by said illumination optical system, wherein said deflection-scanning means is arranged in a conjugate relationship with the illuminated object, in relation to said concave mirror, such that said deflection-scanning means is arranged at a first focus position of said concave mirror and the object is arranged at a second focus position of said concave mirror.

2. An X-ray optical apparatus according to claim 1, wherein said deflection-scanning means comprises a pseudo-conical internal mirror.

3. An X-ray optical apparatus according to claim 2, wherein the object is a mask having a pattern and said projection optical system reduction-projects an image of the pattern onto a wafer.

4. An X-ray optical apparatus according to claim 1, wherein the object is an observation sample and said projection optical system enlargement-projects an image of the sample on an observation surface.

5. An X-ray optical apparatus according to claim 1, wherein said deflection-scanning means comprises one almost normal incident mirror.

6. An X-ray optical apparatus according to claim 1, further comprising a pencil beam X-ray source for generating the X-ray beam, which is an almost parallel beam.

7. An X-ray optical apparatus according to claim 1, further comprising a reflection-type integrator for forming a plurality of light source images.

8. An X-ray optical apparatus according to claim 1, wherein said deflection-scanning means comprises two grazing incident mirrors.

9. A device fabrication method comprising the steps of:

deflection-scanning an X-ray beam using a deflection-scanning device;

reflecting the deflection-scanned X-ray beam by a concave mirror to illuminate a mask having a pattern; and reduction-projecting the pattern of the mask onto a waffer to expose and transfer the pattern from the mask to the waffer, wherein the deflection-scanning device is arranged in a conjugate relationship with the illuminated mask, in relation to the concave mirror, such that the deflection-scanning device is arranged at a first focus position of the concave mirror and the mask is arranged at a second focus position of the concave mirror.

* * * * *

UNITED STATES PATENT AND TRADEMARK OFFICE
CERTIFICATE OF CORRECTION

PATENT NO. : 5,896,438
DATED : April 20, 1999
INVENTOR(S) : AKIRA MIYAKE, ET AL.

It is certified that error appears in the above-indentified patent and that said Letters Patent is hereby corrected as shown below:

COLUMN 2:

line 8, "a" should read --$\sigma$--;
    line 17, "a" should read --$\sigma$--; and
    line 38, "a" should read --$\sigma$--.

COLUMN 5:

line 26, "a spheri-" should read --aspheri- --.

COLUMN 6:

line 17, "a" should read --$\sigma$--.

COLUMN 12:

line 33, "waffer" should read --wafer--; and
    line 34, "waffer," should read --wafer,--.

Signed and Sealed this

Thirtieth Day of November, 1999

Attest:

Q. TODD DICKINSON

*Attesting Officer*     *Acting Commissioner of Patents and Trademarks*